United States Patent
Katoh

(10) Patent No.: US 6,743,293 B2
(45) Date of Patent: Jun. 1, 2004

(54) CRUICIBLE AND GROWTH METHOD FOR POLYCRYSTAL SILICON USING SAME

(75) Inventor: Nobuyuki Katoh, Yoshino-gun (JP)

(73) Assignee: Shusaku Kabushiki Kaiksha, Osaka (JP)

( * ) Notice: Subject to any disclaimer, the term of this patent is extended or adjusted under 35 U.S.C. 154(b) by 253 days.

(21) Appl. No.: 09/994,022

(22) Filed: Nov. 27, 2001

(65) Prior Publication Data

US 2002/0083886 A1 Jul. 4, 2002

(30) Foreign Application Priority Data

Dec. 1, 2000 (JP) .................................... 2000-367779

(51) Int. Cl.[7] ............................................ C30B 35/00
(52) U.S. Cl. ................. 117/200; 65/DIG. 8; 65/30.1; 65/33.1; 117/213; 117/900; 427/255
(58) Field of Search .................. 65/DIG. 8, 30.1, 65/33.1, 33; 117/200, 213, 900; 427/255

(56) References Cited

U.S. PATENT DOCUMENTS

| | | | | |
|---|---|---|---|---|
| 5,373,805 A | * | 12/1994 | Takano et al. | 117/18 |
| 5,919,306 A | * | 7/1999 | Takemura | 117/200 |
| 5,944,890 A | * | 8/1999 | Kitou et al. | 117/101 |
| 6,106,610 A | * | 8/2000 | Watanabe et al. | 117/13 |
| 6,110,274 A | * | 8/2000 | Okuno | 117/81 |
| 6,110,279 A | * | 8/2000 | Kito et al. | 117/105 |
| 6,280,522 B1 | * | 8/2001 | Watanabe et al. | 117/29 |

FOREIGN PATENT DOCUMENTS

JP 05-318160 12/1993

* cited by examiner

Primary Examiner—Felis Hiteshew
(74) Attorney, Agent, or Firm—Nixon & Vanderhye, P.C.

(57) ABSTRACT

A crucible used in the growth of polycrystal silicon by a cast method comprises a crucible body for, when solid material silicon is melted, containing the melted material silicon, and a material holder provided on the crucible body, for holding further material silicon on the material silicon loaded into the crucible body.

9 Claims, 4 Drawing Sheets

CRUCIBLE AND GROWTH METHOD FOR POLYCRYSTAL SILICON USING SAME

BACKGROUND OF THE INVENTION

1. Field of the Invention

The present invention relates to a crucible, and a growth method of polycrystal silicon using the crucible.

2. Description of the Related Art

Polycrystal silicon, which is used, for example, in production of square wafers for solar cells, is grown by a cast method in which a solid material silicon is melted and then coagulated. The growth of polycrystal silicon is typically performed using a crucible shown in FIG. 6.

A crucible 30 is made of silica ($SiO_2$), for example. The crucible 30 has predetermined inner dimensions and thickness and is in the shape of a hollow rectangular parallelepiped having an opening at an upper portion thereof. The crucible 30 is produced by coating an inner surface thereof with silicon nitride followed by baking.

The thus-constructed crucible 30 is used to grow polycrystal silicon. As shown in FIG. 6, a solid material silicon 20 is loaded into the crucible 30. When it is assumed that the crucible 30 has an inner dimension of 70 cm, a thickness of 1.5 cm, and a height of 48 cm, about 250 kg of the solid material silicon 20 can be loaded into the crucible 30, for example.

The crucible 30 in which the material silicon 20 is loaded is heated in a furnace at about 1420° C., which is the melting point of silicon, for about 4 hours. The material silicon 20 loaded into the crucible 30 is melted. In this case, the material silicon 20 loaded into the crucible 30 is all melted as shown in FIG. 7, so that the height of the material silicon 20 becomes about one half of the height of the crucible 30. Thereafter, the melted material silicon 20 in the crucible 30 is cooled for about 15 hours to be coagulated, thereby obtaining a polycrystal silicon ingot 21.

As described above, the crucible 30 is typically in the shape of a rectangular parallelepiped having a predetermined inner dimension. Even though the crucible 30 is filled with the solid material silicon 20, since there are a number of interstices within the solid material silicon 20, it is not possible to efficiently load the material silicon 20 into the crucible 30. Therefore, when the material silicon 20 is melted, the volume of the crucible 30 is reduced so that the height of the material silicon 20 becomes only about one half of the height of the crucible 30. The coagulated polycrystal silicon ingot is formed only to about one half of the height of the crucible 30.

For example, as described above, when the crucible 30 has an inner dimension of 70 cm, a thickness of 1.5 cm, and a height of 48 cm, a polycrystal silicon ingot having only a height of 24 cm in the shape of a rectangular parallelepiped is obtained. Therefore, in order to provide a polycrystal silicon ingot having a predetermined height, a crucible having a depth twice as great as the height of the ingot is required.

The melted material silicon 20 expands when it is coagulated. Therefore, in this case, a great stress acts on the crucible 30. The crucible 30 is typically made of baked silica. When the crucible 30 is subjected to a high temperature of 1420° C. which is the melting point of silicon, since silica is crystallized, the strength of the crucible 30 is reduced so that cracks are likely to occur in the crucible 30. As a result, cracks occur in the crucible 30 every time the material silicon 20 is melt and then coagulated, whereby the crucible 30 may eventually become unusable, causing an economical problem.

SUMMARY OF THE INVENTION

According to an aspect of the present invention, a crucible used in the growth of polycrystal silicon by a cast method comprises a crucible body for, when solid material silicon is melted, containing the melted material silicon, and a material holder provided on the crucible body, for holding further material silicon on the material silicon loaded into the crucible body.

In one embodiment of this invention, the material holder is detachable from the crucible body.

In one embodiment of this invention, an inner space of the material holder for holding the material silicon is gradually increased toward an upper portion of the material holder.

In one embodiment of this invention, a lower portion of the material holder is inserted into and held by an upper portion of the crucible body.

In one embodiment of this invention, a size of the crucible body is designed so that when the material silicon loaded into the crucible body and the material holder is melted, an upper surface of the melted material silicon is positioned close to the upper portion of the crucible body.

In one embodiment of this invention, the material holder is made of a material different from that of the crucible body.

In one embodiment of this invention, the crucible body is made of baked silica, and the material holder is made of a material containing carbon.

In one embodiment of this invention, a groove is provided at a lower portion of the material holder, the groove fits an upper portion of the crucible body, the material holder is held by fitting the groove to the crucible body.

According to another aspect of the present invention, a method for growing polycrystal silicon, comprises the steps of loading a solid material silicon into the crucible body and the material holder of the above-described crucible, heating the loaded material silicon so as to be melted, and coagulating the melted material silicon in the crucible body.

Thus, the invention described herein makes possible the advantages of providing: a crucible with which polycrystal silicon can be efficiently grown and which can be used for a long time and is therefore economical; and a method for efficiently growing polycrystal silicon using the crucible.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
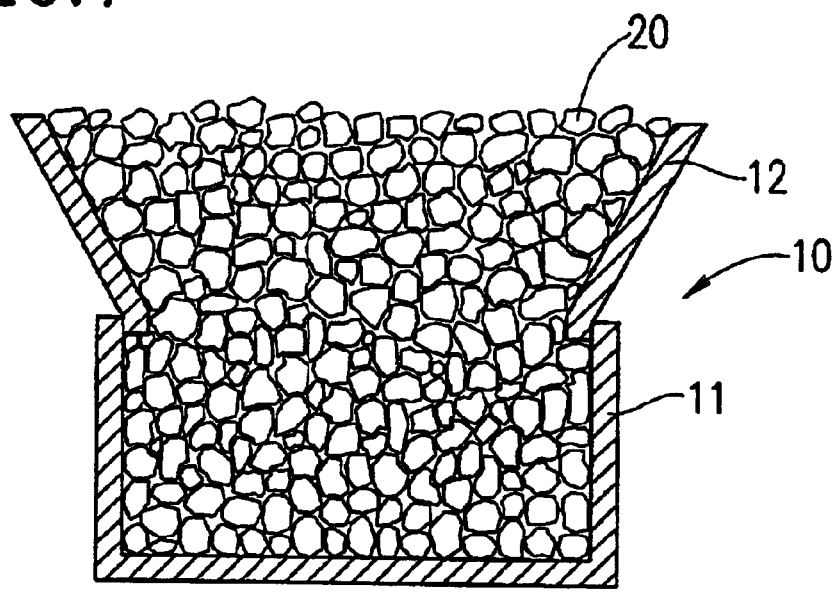
FIG. 1 is a cross-sectional view showing a crucible according to an example of the present invention.

FIG. 1 is a cross-sectional view a crucible according to an example of the present invention, in which the crucible is filled with material silicon. A crucible 10 of the present invention comprises a crucible body 11 in the shape of a hollow rectangular parallelepiped having an opening at an upper portion thereof, and a material holder 12 provided on the crucible body 11 in the shape of an inverted truncated pyramid.

The crucible body 11 is produced as follows: silica ($SiO_2$), for example, is shaped into a rectangular parallelepiped having an opening at an upper portion thereof and having a predetermined inner dimension, a predetermined thickness, and a predetermined height; and the inner surface is coated with silicon nitride, followed by baking. The crucible body 11 may have an inner dimension of 70 cm, a thickness of 1.5 cm, and a height of 30 cm, for example.

The material holder 12 provided on the crucible body 11 is detachable from the crucible body 11. The material holder 12 is concentrically attached to an upper portion of the crucible body 11. The entirety of the material holder 12 has substantially a uniform thickness. The outer and inner dimensions of the material holder 12 are gradually increased toward the upper portion thereof. The outer dimension of a lower portion of the material holder 12 is smaller by 1 to 2 cm than the inner dimension of the upper portion of the crucible body 11 so that the lower portion of the material holder 12 can be inserted into the upper portion of the crucible body 11.

The material holder 12 is made of a substance containing carbon, such as graphite, and has a predetermined shape. The material holder 12 is produced by coating the inner surface thereof with silicon nitride followed by baking. The material holder 12 has an inner dimension of 65 cm and a height of 18 cm at the lower portion thereof, and an inner dimension of 100 cm and a thickness of 1.5 cm at the upper portion thereof, for example.

Referring to FIG. 1, when the thus-constructed crucible 10 is used to grow polycrystal silicon, the solid material silicon 20 is loaded into the crucible body 11 and the material holder 12 with the material holder 12 attached to the crucible body 11. In this case, material silicon 20 is provided on top of the material silicon 20 in the crucible body 11.

When, as described above, the crucible body 11 has an inner dimension of 70 cm, a thickness of 1.5 cm, and a height of 30 cm, and the material holder 12 has an inner dimension of 65 cm and a height of 18 cm at the lower portion thereof and an inner dimension of 100 cm and a thickness of 1.5 cm at the upper portion thereof, about 290 kg of the solid material silicon 20 is loaded into the crucible body 11 and the material holder 12.

Figure 2:
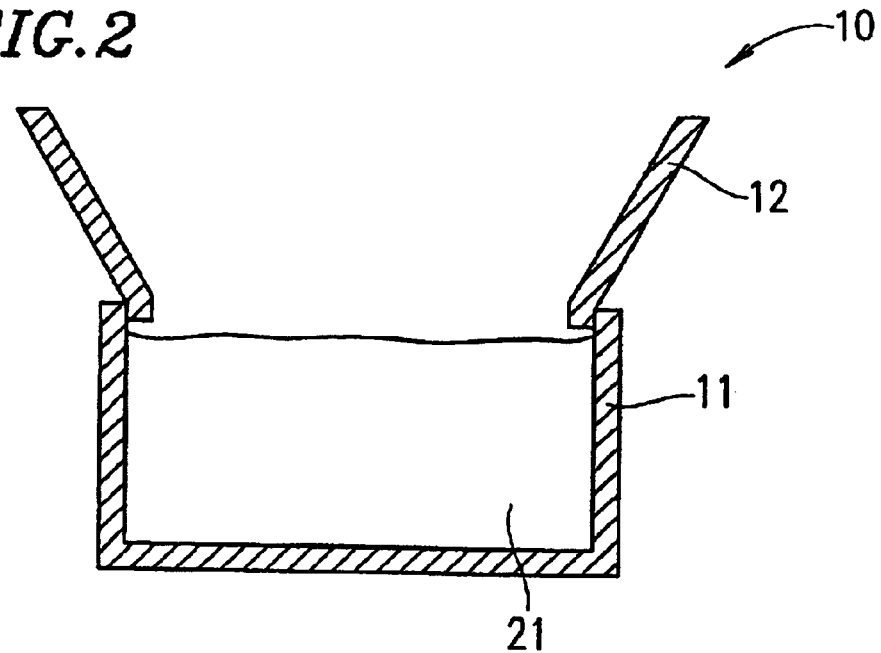
FIG. 2 is a cross-sectional view showing a state of the crucible shown in FIG. 1 in which a polycrystal silicon ingot is formed.

In this situation, the entire crucible 10 is heated in a furnace at about 1420° C., which is the melting point of silicon, for about 4 hours, so that all the material silicon 20 contained in the crucible 10 is melted. Therefore, all the solid material silicon 20 contained in the crucible body 11 and the material holder 12 is melted as shown in FIG. 2 and is then contained in only the crucible body 11, so that an upper surface of the melted material silicon 20 is close to the upper portion of the crucible body 11.

Thereafter, the melted material silicon 20 is cooled along with the crucible body 11 for about 15 hours, whereby the melted material silicon 20 in the crucible body 11 is coagulated. Thus, a polycrystal silicon ingot 21 is obtained.

As described above, the solid material silicon 20 is loaded into not only the crucible body 11 but also the material holder 12 provided on the crucible body 11. A larger amount of the material silicon 20 can be loaded into the crucible body 11 than when the solid material silicon 20 is contained in only the crucible body 11. The capacity of the crucible body 11 is designed so that when material silicon loaded into the crucible body 11 and the material holder 12 is melted, all the melted material silicon is contained in the crucible body 11. Therefore, substantially the entirety of the melted material silicon is contained in the crucible body 11, whereby the polycrystal silicon ingot 21 coagulated in the crucible body 11 is in the shape of a rectangular parallelepiped having a great height.

As described above, When about 290 kg of material silicon is loaded into the crucible 10, a polycrystal silicon ingot having a height of 28 cm is obtained in the crucible body 11 having an inner dimension of 70 cm, a thickness of 1.5 cm, and a height of 30 cm.

The melted material silicon 20 expands when it is coagulated. In this case, a great stress acts on the crucible body 11. When the crucible body 11 made of baked silica is subjected to a high temperature of 1420° C. which is the melting point of silicon, since silica is crystallized, the strength of the crucible body 11 is reduced so that cracks are likely to occur in the crucible body 11.

In contrast, the material holder 12 is detachable from the crucible body 11, and is made of a material different from that of the crucible body 11, such as baked graphite containing carbon. It is not likely that the material holder 12 is affected by expansion of the material silicon 20 when it is coagulated in the crucible body 11, whereby the material holder 12 is prevented from being damaged. Therefore, even when cracks occur in the crucible body 11 and cause it to be unusable, only the crucible body 11 is replaced and the material holder 12 can be repeatedly reused. This results in a cost saving since to obtain a similar sized ingot a smaller crucible than that conventionally implemented is used. Hence, only a smaller crucible needs replacing.

Figure 3:
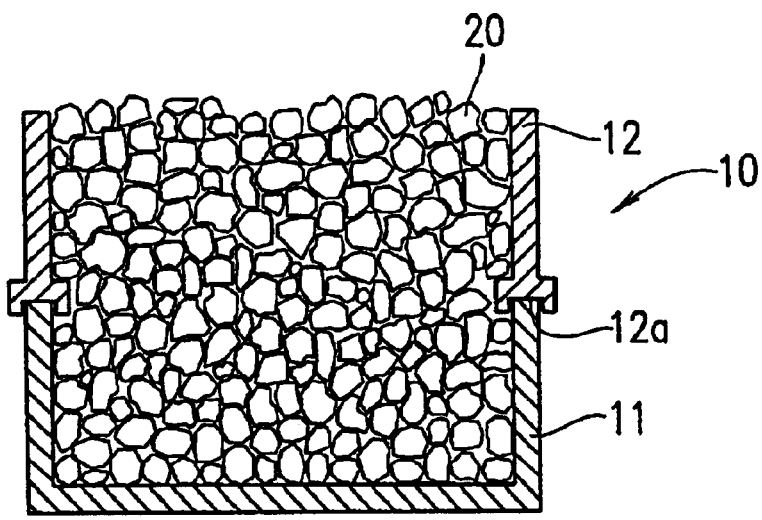
FIG. 3 is a cross-sectional view showing a crucible according to another example of the present invention.

FIG. 3 is a cross-sectional view showing another example of the crucible 10 of the present invention. The crucible 10 comprises a crucible body 11 similar to that of the crucible 10 shown in FIG. 1, and a detachable material holder 12 which has a structure different from that of the material holder 12 shown in FIG. 1.

The material holder 12 is in the shape of a rectangular parallelepiped having inner and outer dimensions similar to those of the crucible body 11. An upper portion and a lower portion of the material holder 12 are open. The material holder 12 has a uniform thickness in a vertical direction except for a lower portion thereof.

A groove 12a is provided throughout a perimeter of the lower portion of the material holder 12, which fits the upper portion of the crucible body 11. When the groove 12a is fitted to the upper portion of the crucible body 11, the material holder 12 is concentrically held on the crucible body 11.

Similar to the material holder 12 shown in FIG. 1, the material holder 12 is made of graphite and has a predetermined shape. The material holder 12 is produced by coating an inner surface thereof with silicon nitride followed by baking.

In the thus-constructed crucible 10, the crucible body 11 has dimensions similar to those of the crucible body 11 of the crucible 10 shown in FIG. 1, and the material holder 12 has an inner dimension of 70 cm and an thickness of 1.5 cm, which are similar to those of the crucible body 11. A height of the material holder 12 is 22 cm, for example.

Referring to FIG. 3, when the thus-constructed crucible 10 is used to grow polycrystal silicon, the groove 12a provided at the lower portion of the material holder 12 is fitted to the upper portion of the crucible body 11 so that the material holder 12 is held on the crucible body 11. In this situation, solid material silicon 20 is loaded into the crucible body 11 and the material holder 12. When the crucible 10 has the above-described dimensions, about 250 kg of the solid material silicon 20 is loaded into the crucible body 11 and the material holder 12.

Figure 4:
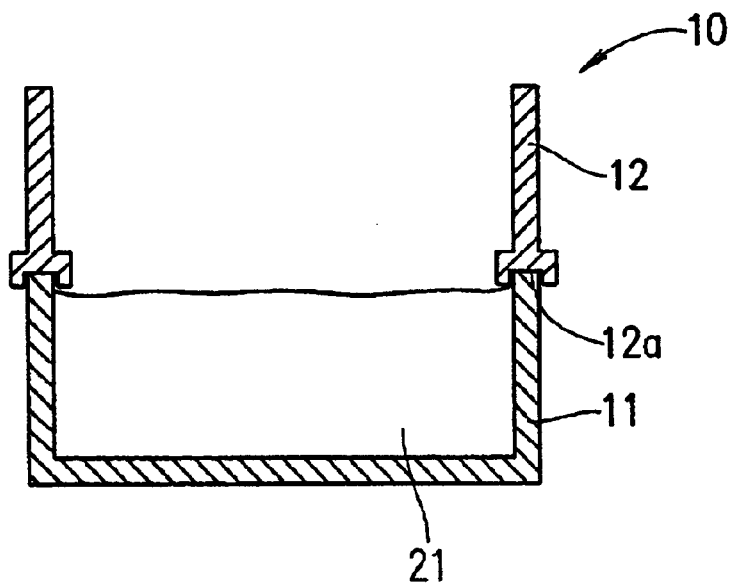
FIG. 4 is a cross-sectional view showing a state of the crucible shown in FIG. 3 in which a polycrystal silicon ingot is formed.
Figure 5:
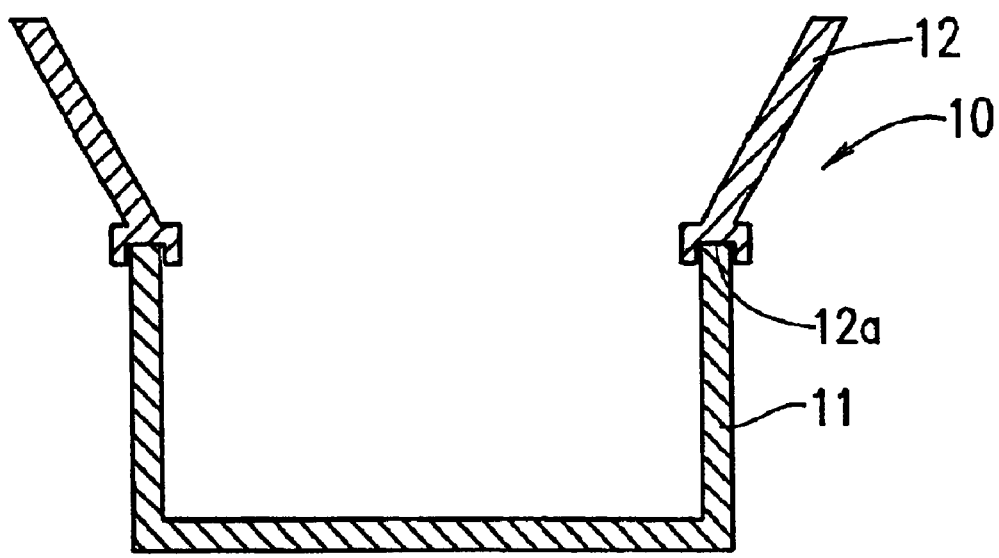
FIG. 5 is a cross-sectional view showing a crucible according to still another example of the present invention.
Figure 6:
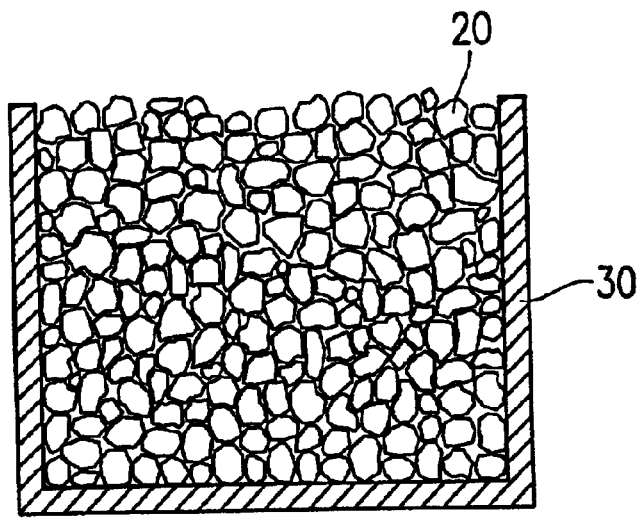
FIG. 6 is a cross-sectional view showing an example of a conventional crucible in a working state.
Figure 7:
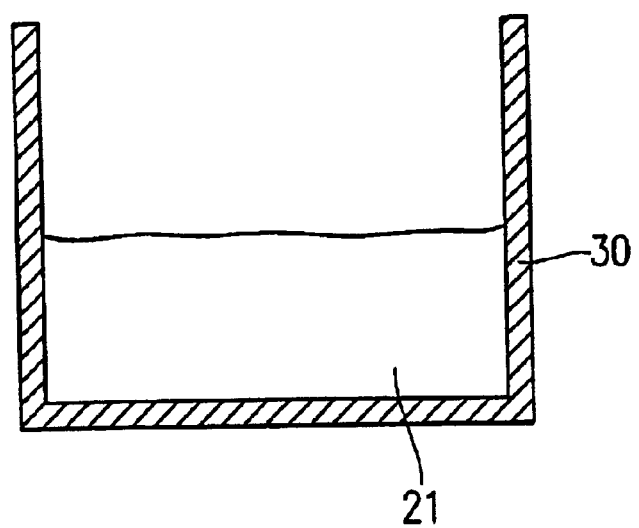
FIG. 7 is a cross-sectional view showing a state of the crucible shown in FIG. 6 in which a polycrystal silicon ingot is formed.

In this situation, the entire crucible 10 is heated in a furnace at about 1420° C. for about 4 hours, so that all the material silicon 20 contained in the crucible 10 is melted. Therefore, all the solid material silicon 20 contained in the crucible body 11 and the material holder 12 is melted as shown in FIG. 4 and is then contained in only the crucible body 11, so that an upper surface of the melted material silicon 20 is close to the upper portion of the crucible body 11.

Thereafter, the melted material silicon 20 is cooled for about 15 hours, whereby the melted material silicon 20 in the crucible body 11 is coagulated. Thus, a polycrystal silicon ingot 21 is obtained.

Similarly, the solid material silicon 20 is loaded into not only the crucible body 11 but also the material holder 12 provided on the crucible body 11. A larger amount of the material silicon 20 can be loaded into the crucible body 11 than when the solid material silicon 20 is loaded into only the crucible body 11. As a result, the resultant polycrystal silicon ingot 21 is in the shape of a rectangular parallelepiped having a great height (e.g., 24 cm).

The strength of the crucible 10 is also reduced when the crucible body 11 made of baked silica is subjected to a high temperature, so that cracks are likely to occur in the crucible 10. In contrast, the material holder 12 detachable from the crucible body 11 is not likely to be damaged. Therefore, even when the crucible body 11 becomes unusable, the material holder 12 can be repeatedly reused.

Note that although in the crucible 10 shown in FIG. 1, the lower portion of the truncated pyramid-shaped material holder 12 is inserted into the upper portion of the crucible body 11, a groove 12a may be provided at the lower portion of the material holder 12 throughout the perimeter thereof, which fits the upper portion of the crucible body 11. In this case, the material holder 12 is held on the crucible body 11 by fitting the groove 12a of the material holder 12 to the crucible body 11.

As described above, in the crucible of the present invention, a material holder is provided on a crucible body so that material silicon can be held on material silicon loaded into the crucible body, whereby a large amount of melted material silicon can be contained in the crucible body and a large size polycrystal silicon ingot is obtained. Therefore, a large size polycrystal silicon ingot can be obtained by cast method. Further, the material holder is detachable from the crucible body, and is made of a material different from that of the crucible body which enhances the strength of the material holder. Therefore, even when the crucible body becomes unusable, the material holder can be repeatedly used, thereby improving the economy.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A crucible used in the growth of a polycrystal silicon by a cast method, comprising:
    a crucible body for, when a solid material silicon is melted, containing the melted material silicon; and
    a material holder provided on the crucible body, for holding further material silicon on the material silicon loaded into the crucible body.

2. A crucible according to claim 1, wherein the material holder is detachable from the crucible body.

3. A crucible according to claim 2, wherein a lower portion of the material holder is inserted into and held by an upper portion of the crucible body.

4. A crucible according to claim 2, wherein the material holder is made of a material different from that of the crucible body.

5. A crucible according to claim 4, wherein the crucible body is made of baked silica, and the material holder is made of a material containing carbon.

6. A crucible according to claim 2, wherein a groove is provided at a lower portion of the material holder, the groove fits an upper portion of the crucible body, the material holder is held by fitting the groove to the crucible body.

7. A crucible according to claim 1, wherein an inner space of the material holder for holding the material silicon is gradually increased toward an upper portion of the material holder.

8. A crucible according to claim 1, wherein a size of the crucible body is designed so that when the material silicon loaded into the crucible body and the material holder is melted, an upper surface of the melted material silicon is positioned close to the upper portion of the crucible body.

9. A method for growing a polycrystal silicon, comprising the steps of:
    loading a solid material silicon into the crucible body and the material holder of the crucible of claim 1;
    heating the loaded material silicon so as to be melted; and
    coagulating the melted material silicon in the crucible body.

* * * * *